United States Patent
Roig-Guitart et al.

(10) Patent No.: US 11,018,129 B2
(45) Date of Patent: May 25, 2021

(54) CIRCUIT THAT CHANGES VOLTAGE OF BACK ELECTRODE OF TRANSISTOR BASED ON ERROR CONDITION

(71) Applicant: SEMICONDUCTOR COMPONENTS INDUSTRIES, LLC, Phoenix, AZ (US)

(72) Inventors: Jaume Roig-Guitart, Oudenaarde (BE); Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 319 days.

(21) Appl. No.: 16/125,921

(22) Filed: Sep. 10, 2018

(65) Prior Publication Data

US 2020/0083214 A1 Mar. 12, 2020

(51) Int. Cl.
| | | |
|---|---|---|
| *H01L 27/02* | (2006.01) | |
| *H01L 27/06* | (2006.01) | |
| *H01L 29/778* | (2006.01) | |
| *H01L 29/20* | (2006.01) | |

(52) U.S. Cl.
CPC ...... *H01L 27/0292* (2013.01); *H01L 27/0629* (2013.01); *H01L 29/2003* (2013.01); *H01L 29/7787* (2013.01)

(58) Field of Classification Search
CPC ............. H01L 27/0292; H01L 27/0629; H01L 27/2003; H01L 27/7787
See application file for complete search history.

(56) References Cited

U.S. PATENT DOCUMENTS

| | | | | |
|---|---|---|---|---|
| 6,031,702 A | * | 2/2000 | Williams | H02H 7/1213 |
| | | | | 361/87 |
| 7,924,083 B2 | * | 4/2011 | Chou | H03K 17/063 |
| | | | | 327/391 |
| 9,190,826 B2 | * | 11/2015 | Pansier | H02H 1/0007 |
| 10,115,818 B1 | * | 10/2018 | Eggermont | H01L 29/1087 |
| 2003/0058593 A1 | | 3/2003 | Bertele et al. | |
| 2004/0130002 A1 | | 7/2004 | Weeks et al. | |

(Continued)

FOREIGN PATENT DOCUMENTS

WO 2005041393 A2 5/2005

OTHER PUBLICATIONS

Chu et al., "High Performance GaN on Si Power Switch: Role of Substrate Bias in Device Characteristics", 69th Device Research Conference, Santa Barbara, CA, USA, Jun. 20-22, 2011 (pp. 223-224).

(Continued)

*Primary Examiner* — Scott Bauer
(74) *Attorney, Agent, or Firm* — Brake Hughes Bellermann LLP

(57) ABSTRACT

A circuit can comprise a transistor, a sensor, and a switch. The transistor can include a drain electrode, a gate electrode, a source electrode, and a back electrode. The sensor can be configured to detect an error condition in the transistor. The switch can be configured to change a voltage at the back electrode in response to the sensor detecting the error condition in the transistor, the change of the voltage at the back electrode reducing current flow between the drain electrode and the source electrode.

20 Claims, 9 Drawing Sheets

(56) References Cited

U.S. PATENT DOCUMENTS

| | | | |
|---|---|---|---|
| 2009/0115386 A1* | 5/2009 | Otaka | H02M 3/07 |
| | | | 323/282 |
| 2010/0321849 A1 | 12/2010 | Tang et al. | |
| 2011/0304311 A1 | 12/2011 | Takahashi et al. | |
| 2012/0211800 A1 | 8/2012 | Boutros | |
| 2017/0179825 A1 | 6/2017 | Roig-Guitart et al. | |
| 2018/0270913 A1* | 9/2018 | Bredemeier | H03K 17/0828 |

OTHER PUBLICATIONS

Weiss et al., "Substrate Biasing Effects in a High-Voltage, Monolithically-Integrated Half-Bridge GaN-Chip", 2017 IEEE 5th Workshop on Wide Bandgap Power Devices and Applications (WiPDA), Albuquerque, NM, USA, Oct. 30-Nov. 1, 2017 (8 pages).

Huang et al., "Experimental Study of 650V AlGaN/GaN HEMT Short-Circuit Safe Operating Area (SCSOA)", Proceedings of the 26th International Symposium on Power Semiconductor Devices & ICs, Waikoloa, HI, USA, Jun. 15-19, 2014 (4 pages).

Eum et al., "Highly reliable GaN MOS-HFET with high short-circuit capability", Proceedings of The 29th International Symposium on Power Semiconductor Devices & ICs, Sapporo, Japan, May 28-Jun. 1, 2017 (4 pages).

Moench et al., "Substrate Potential of High-Voltage GaN-on-Si HEMTs and Half-Bridges: Static and Dynamic Four-Terminal Characterization and Modeling", 2017 IEEE 18th Workshop on Control and Modeling for Power Electronics (COMPEL), Stanford, CA, USA, Jul. 9-12, 2017 (8 pages).

Li et al., "E-mode GaN HEMT Short Circuit Robustness and Degradation", 2017 IEEE Energy Conversion Congress and Exposition (ECCE), Cincinnati, OH, USA, Oct. 1-5, 2017 (8 pages).

Jones et al., "A Fast Overcurrent Protection Scheme for GaN GITs", 2017 IEEE 5th Workshop on Wide Bandgap Power Devices and Applications (WiPDA), Albuquerque, NM, USA, Oct. 30-Nov. 1, 2017 (8 pages).

Miyazaki et al., "20-ns Short-Circuit Detection Scheme with High Variation-Tolerance based on Analog Delay Multiplier Circuit for Advanced IGBTs", 2016 IEEE 2nd Annual Southern Power Electronics Conference (SPEC), Auckland, New Zealand, Dec. 5-8, 2016 (4 pages).

Nagahisa et al., "Robust 600V GaN high electron mobility transistor technology on GaN-on-Si with 400V, 5 μs load-short-circuit withstand capability", Japanese Journal of Applied Physics, vol. 55, No. 4S, Feb. 24, 2016 (12 pages).

* cited by examiner

CIRCUIT THAT CHANGES VOLTAGE OF BACK ELECTRODE OF TRANSISTOR BASED ON ERROR CONDITION

TECHNICAL FIELD

This description relates to electronic circuits, including preventing damage due to overstress of the electronic circuits.

BACKGROUND

Switches, such as Gallium Nitride (GaN) transistors, can be damaged quickly due to power or current surges. Transistors that are on can become damaged during short-circuit events.

SUMMARY

According to an example, a circuit can comprise a transistor, a sensor, and a switch. The transistor can include a drain electrode, a gate electrode, a source electrode, and a back electrode. The sensor can be configured to detect an error condition in the transistor. The switch can be configured to change a voltage at the back electrode in response to the sensor detecting the error condition in the transistor, the change of the voltage at the back electrode reducing current flow between the drain electrode and the source electrode.

A circuit can comprise a common node, a transistor, a current source, a switch coupled to the current source and to the common node, a capacitor coupled to the current source and to a back electrode of the transistor, a diode, a sensor configured to detect an error condition at the transistor, and a switch. The transistor can include a drain electrode, a gate electrode, a source electrode, and the back electrode, the source electrode being electrically coupled to the common node. The diode can include an anode and a cathode. The anode can be electrically coupled to the capacitor and the back electrode. The cathode can be electrically coupled to the common node. The switch controller can be configured to cause the switch to conduct current between the current source and the common node in response to the sensor detecting the error condition.

A circuit can include a common node, a transistor, a current source, a capacitor, a first switch, a second switch, a diode, a sensor configured to detect an error condition at the transistor, and a switch controller configured to cause the first switch not to conduct current between the current source and the common node in response to the sensor detecting the error condition. The transistor can include a drain electrode, a gate electrode, a source electrode, and a back electrode, the source electrode being electrically coupled to the common node. The capacitor can be coupled to the current source and to the back electrode. The first switch can include a first node and a second node, the first node being electrically coupled to the capacitor, the back electrode and the second node being electrically coupled to the common node. The second switch can be coupled to the current source and to the common node. The diode can include an anode and a cathode. The anode can be electrically coupled to the capacitor, the back electrode, and the first node of the first switch. The cathode can be electrically coupled to the common node.

A circuit can include a common node, a transistor, a current source, a switch coupled to the current source and to the common node, a capacitor coupled to the current source, a first diode, a second diode, a sensor configured to detect an error condition at the transistor, and a switch controller configured to cause the switch to conduct current between the current source and the common node in response to the sensor detecting the error condition. The transistor can include a drain electrode, a gate electrode, a source electrode, and a back electrode, the source electrode being electrically coupled to the common node. The first diode can include a first anode and a first cathode. The first anode can be electrically coupled to the capacitor. The first cathode can be electrically coupled to the common node. The second diode can include a second anode and a second cathode. The second anode can be electrically coupled to the back electrode. The second cathode can be electrically coupled to the first anode and to the capacitor.

The details of one or more implementations are set forth in the accompanying drawings and the description below. Other features will be apparent from the description and drawings, and from the claims.

DETAILED DESCRIPTION

To prevent damage to a transistor, a circuit can detect an error condition in the transistor and change a voltage at a body or back electrode of the transistor. The change of the voltage at the body or back electrode can reduce current flow through the transistor, such as by increasing a threshold voltage of a gate of the transistor, taking advantage of the body effect that enables the body or back electrode to act as another gate for the transistor. The reduction in current flow can prevent damage to the transistor and/or other components.

Figure 1:
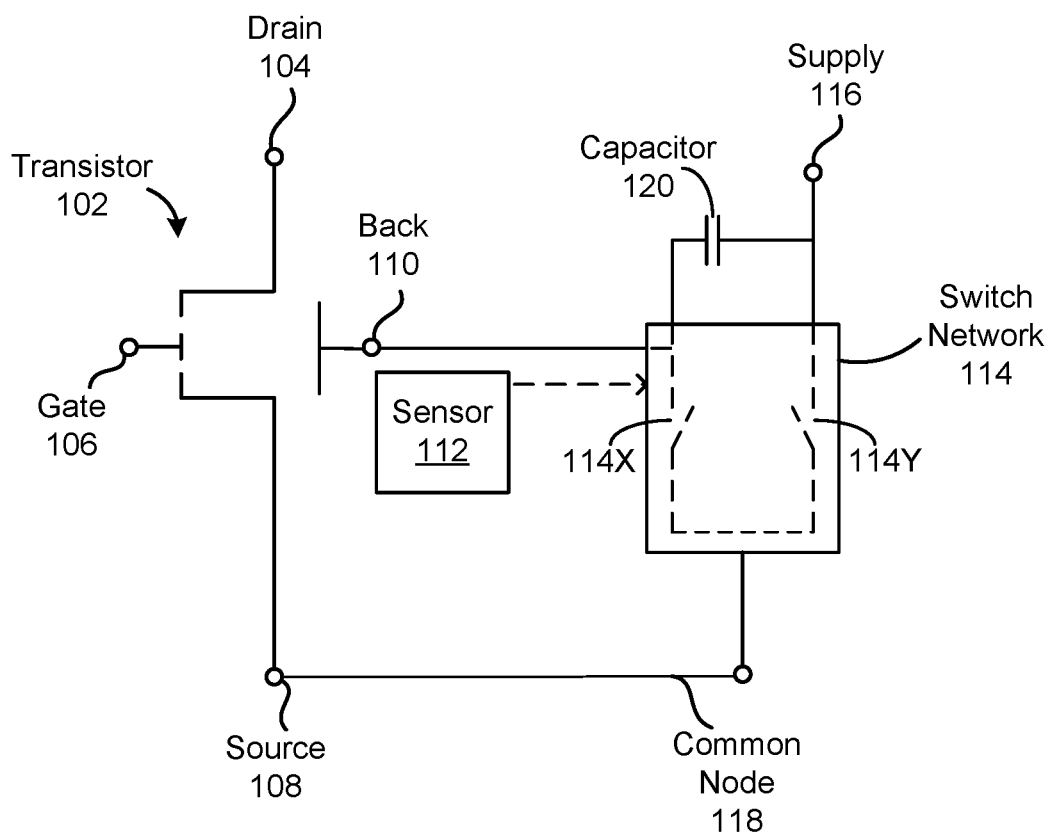
FIG. 1 is a diagram of a circuit for changing a voltage of a back electrode of a transistor in response to detecting an error condition according to an example.

FIG. 1 is a diagram of a circuit for changing a voltage of a back electrode 110 of a transistor 102 in response to detecting an error condition according to an example. In some examples, the transistor 102 can be implemented in a Gallium Nitride (GaN) substrate, a GaN-On-Silicon substrate, a GaN-On-Silicon Carbide (SiC) substrate, a GaN-On-Sapphire substrate, and/or as a GaN transistor. In some examples, a GaN transistor can be selected for high-power and/or high-temperature applications. The transistor 102 can include a positively-doped GaN transistor, a high-electron-mobility transistor (HEMT), a depletion HEMT (DHEMT), a GaN metal-insulator-semiconductor (MIS) HEMT, or a metal-oxide-semiconductor field-effect transistor (MOSFET), as non-limiting examples. In the example of GaN transistors, the circuit's response to the error condition can compensate for GaN transistors' susceptibility to short circuiting due to the large thermal impedance of GaN transistors at short times. The transistor 102 can include a drain electrode 104, a gate electrode 106, a source electrode 108, and the back electrode 110. In some implementations, the transistor 102 can include one or more semiconductor materials in addition to, or different from GaN, such as lateral transistors integrated on the top of a semiconductor substrate and isolated from the substrate bulk by a capacitance (which can be a dielectric or junction capacitance), and/or power transistors integrated in Silicon-On-Insulator.

The circuit can include a sensor 112 configured to detect an error condition in the transistor 102. The sensor 112 can perform measurements on the transistor 102, and determine whether measured values meet and/or exceed a threshold that satisfies an error condition. The error condition can include a measured temperature at a measured electrode meeting or exceeding a temperature threshold, a measured current across a measured electrode meeting or exceeding a current threshold, or a measured voltage at a measured electrode or across two measured electrodes meeting or exceeding a voltage threshold, as non-limiting examples. In some examples, the measured electrode can include the drain electrode 104, as shown in FIG. 2A, the source electrode 108 as shown in FIG. 2B, or the gate electrode 106 as shown in FIG. 2C.

In some implementations, sensor 112 can measure two of, or all three of, the drain electrode 104, source electrode 108, and/or gate electrode 106. In some examples, the sensor 112 can measure two or three of the temperature, current, and/or voltage at one, two, or three of the drain electrode 104, source electrode 108, and/or gate electrode 106, and determine whether both the temperature threshold, current threshold, and/or voltage threshold are satisfied or exceeded.

In some implementations, the transistor 102 can be implemented in a GaN substrate (and/or GaN epitaxial layer associated with a substrate) and can be co-packaged (e.g., included in separate semiconductor die and molded within a single package or module) and/or co-integrated with the remaining components, such as the sensor 112, supply 116, capacitor 120, the switch network 114, and/or the common node 118, with the remaining components being implemented in a silicon substrate. In some implementations, the transistor 102 and the capacitor 120 can be implemented in a GaN substrate and the remaining components, with which the transistor 102 and capacitor 120 are co-packaged and/or co-integrated, can be implemented in silicon. In some implementations, all of the components can be implemented in, packaged in, and/or integrated in a GaN substrate. The wide band-gap of GaN can be beneficial for high-power and/or high-frequency applications.

Figure 2A:
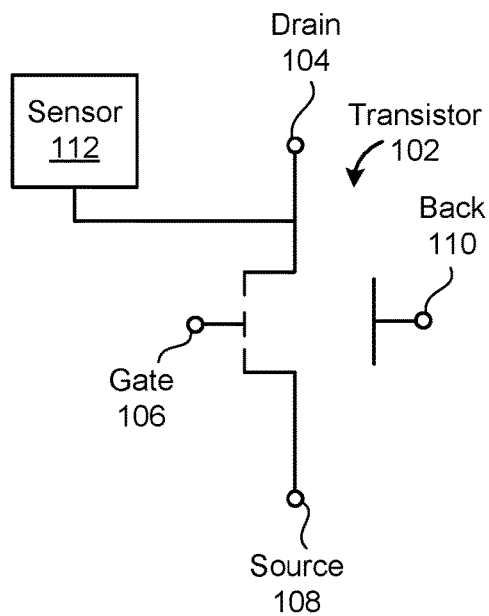
FIG. 2A is a diagram of a sensor and the transistor of FIG. 1 according to an example.
Figure 2B:
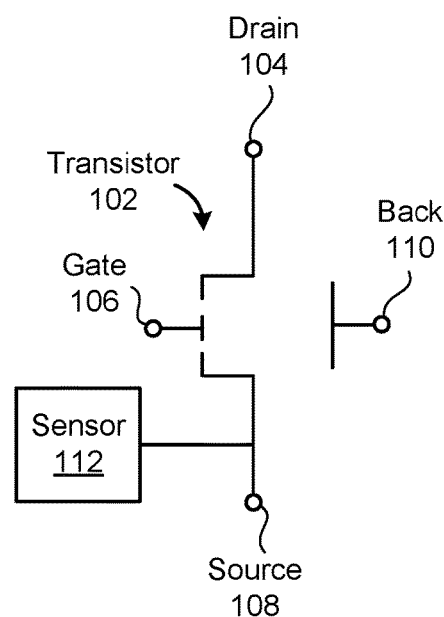
FIG. 2B is a diagram of a sensor and the transistor of FIG. 1 according to an example.
Figure 2C:
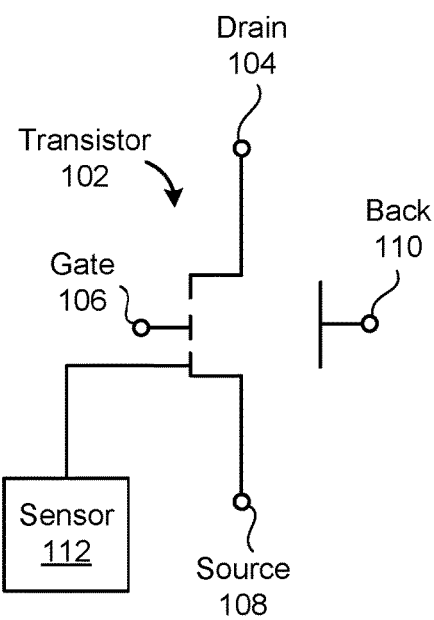
FIG. 2C is a diagram of a sensor and the transistor of FIG. 1 according to an example.

FIG. 2A is a diagram of the sensor 112 and the transistor 102 of FIG. 1 according to an example. In this example, the sensor 112 measures a property, such as temperature, current, and/or voltage, at the drain electrode 104.

FIG. 2B is a diagram of the sensor and the transistor of FIG. 1 according to an example. In this example, the sensor 112 measures a property, such as temperature, current, and/or voltage, at the source electrode 108.

FIG. 2C is a diagram of a sensor and the transistor of FIG. 1 according to an example. In this example, the sensor 112 measures a property, such as temperature, current, and/or voltage, at the gate electrode 106.

Returning to FIG. 1, the sensor 112, and/or a controller (shown in FIGS. 4, 5, 6, 7, and 9) coupled to and/or receiving signals from the sensor 112, can control and/or change the voltage at the back electrode 110 by opening or closing a switch network 114 coupled to the back electrode 110. The switch network 114 can include one or more switches 114X, 114Y. Either or both of the switches 114X, 114Y can include a transistor, such as a high-electron-mobility transistor (HEMT). Either or both of the switches 114X, 114Y in the switch network 114 can include a transistor, such as a metal-insulator-semiconductor HEMT (MISHEMT).

The opening (e.g., turning off) or closing (e.g., turning on) of the switch network 114 can control and/or change the voltage at the back electrode 110. The capacitor 120 can cause the voltage at the back electrode 110 to be capacitively pushed negative with respect to the source electrode 108 after the switch 114Y is closed and/or turned on. In some examples, where the transistor 102 is an n-channel device, the sensor 112 and/or switch network 114 can reduce the voltage at the back electrode 110, raising the threshold voltage at the gate 106, which can turn the transistor 102 off and stop the transistor 102 from conducting current, preventing damage to the transistor 102. In some examples, the switch network 114 can reduce the voltage at the back electrode 110 by closing the switch 114X, coupling the back electrode 110 to a common node 118, which brings the voltage at the back electrode 110 to a lower voltage than when the switch 114X was open and the back electrode 110 was coupled to a supply voltage 116 via a capacitor 120. In some examples, the switch network 114 can reduce the voltage at the back electrode by closing the switch 114Y, coupling the capacitor 120 to the common node 118, which reduces the voltage at the back electrode 110. The supply 116 can include a current source or a voltage source, according to example implementations. In some examples, the supply 116 can be a supply with nonzero and/or non-infinite impedance that features an output impedance larger than the on-resistance of switch 114X that is coupled to the supply 116. The output impedance of the supply 116 can cause the supply 116 to act as a current source in comparison to the switch 114X.

In an n-channel example, the switch network 114 can increase the absolute magnitude of the voltage, such as by making the voltage at the back electrode 110 negative due to the closing of the switch 114Y coupled to the capacitor 120, coupling the back electrode 110 to a supply voltage 116 via the capacitor 120, which brings the voltage at the back electrode 110 to a negative voltage. During regular operation, the voltage between the back electrode 110 and the source electrode 108 can approach zero, but during a surge event when the switch 114Y is closed, the voltage between the back electrode 110 and the source electrode 108 can be negatively proportional (equal in magnitude but opposite in sign or polarity) to the voltage between the drain electrode 104 and the source electrode 108.

In some examples, where the transistor 102 is a p-channel device, the sensor 112 and/or switch network 114 can increase the voltage at the back electrode 110, reducing (and/or making more negative or increasing an absolute value of) the threshold voltage at the gate 106, which can turn the transistor 102 off and stop the transistor 102 from conducting current, preventing damage to the transistor 102. The change in the voltage at the back electrode 110 can reduce the current flowing through the transistor 102 when an increase in the voltage at the gate electrode 106 would otherwise increase the current flowing through the transistor 102. The reduction in current flowing through the transistor 102 can prevent damage to the transistor 102.

Figure 3:
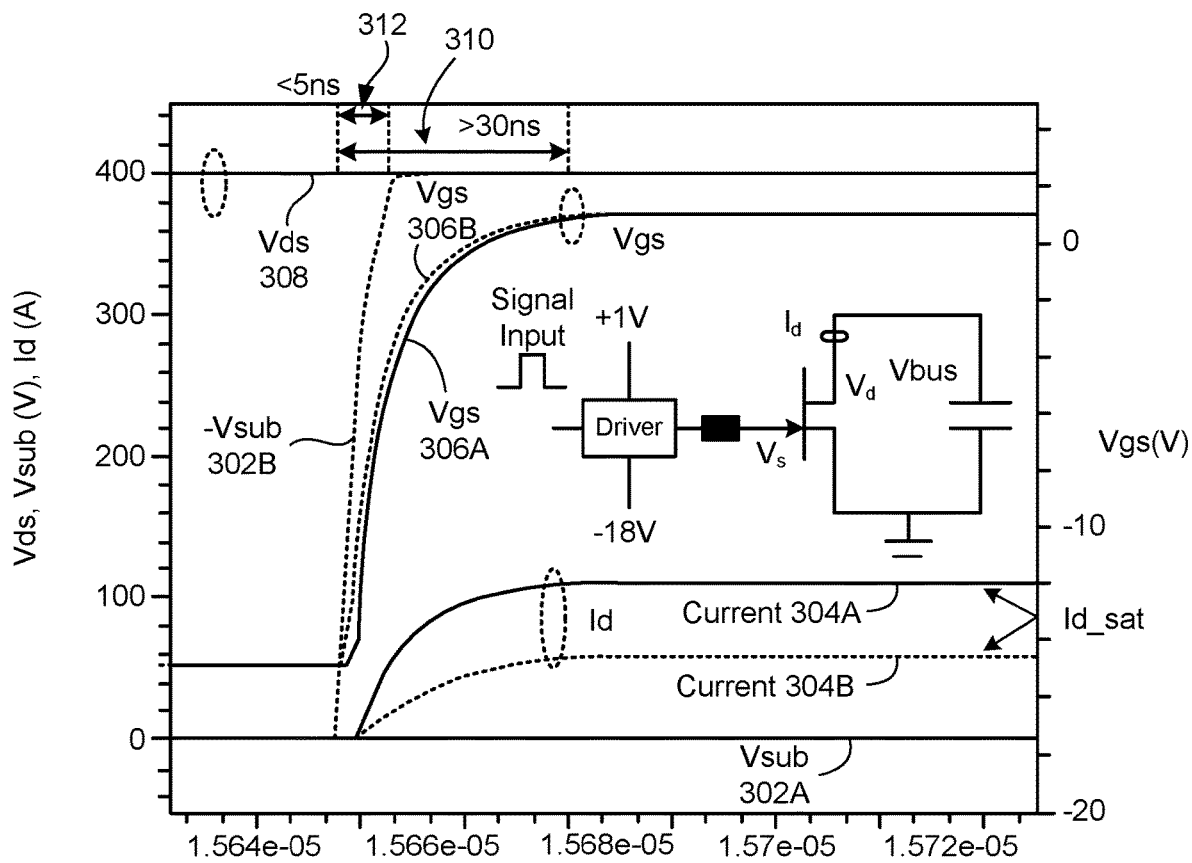
FIG. 3 is a graph showing voltages and currents in the circuit of FIG. 1 according to an example.

FIG. 3 is a graph showing voltages 302A, 302B, 306A, 306B and currents 304A, 304B in the circuit of FIG. 1 according to an example based on a DHEMT. In this example, the Vbus voltage is 400 volts, the resistances in series to gate and substrate are both nine ohms, the voltage supplied by the driver decreases from one volt to negative eighteen volts, the ramp time is one nanosecond, and the voltage across the capacitor ranges from zero to negative four hundred volts.

Without the change to the voltage at the back electrode 110, denoted $V_{SUB}$ 302A for substrate voltage, the voltage $V_{SUB}$ 302A would remain constant, such as at zero or ground. With the change to the voltage of the back electrode 110, the absolute value of the voltage at the back electrode 110, denoted $V_{SUB}$ 302B for substrate voltage, increases, such as from zero to negative four hundred volts over a short time period 312, such as five nanoseconds. Either with or without the change to the voltage of the back electrode 110, the voltage at the gate electrode 106, denoted $V_{gs}$ (306A indicates the voltage at the gate electrode 106 when the voltage at the back electrode 110 does not change and 306B indicates the voltage at the gate electrode 106 when the voltage at the back electrode 110 does change), increases over a longer time period 310 than the increase of the voltage at the back electrode 110, such as from a negative value such as negative fifteen volts, to a small positive value such as one volt. The current 304B through the transistor 102 from the drain electrode 104 to the source electrode 108 increases by a smaller amount in response to the increase in the gate voltage 306A, 306B when the voltage at the back electrode 110 $V_{SUB}$ 302B increases, such as from zero to fifty amperes, than when the voltage at the back electrode 110 $V_{SUB}$ 302A remains constant (when the current 304A increases from zero to one hundred amperes). These voltage and current values are merely examples. The reduced increase in current can reduce damage to the transistor 102.

Figure 4:
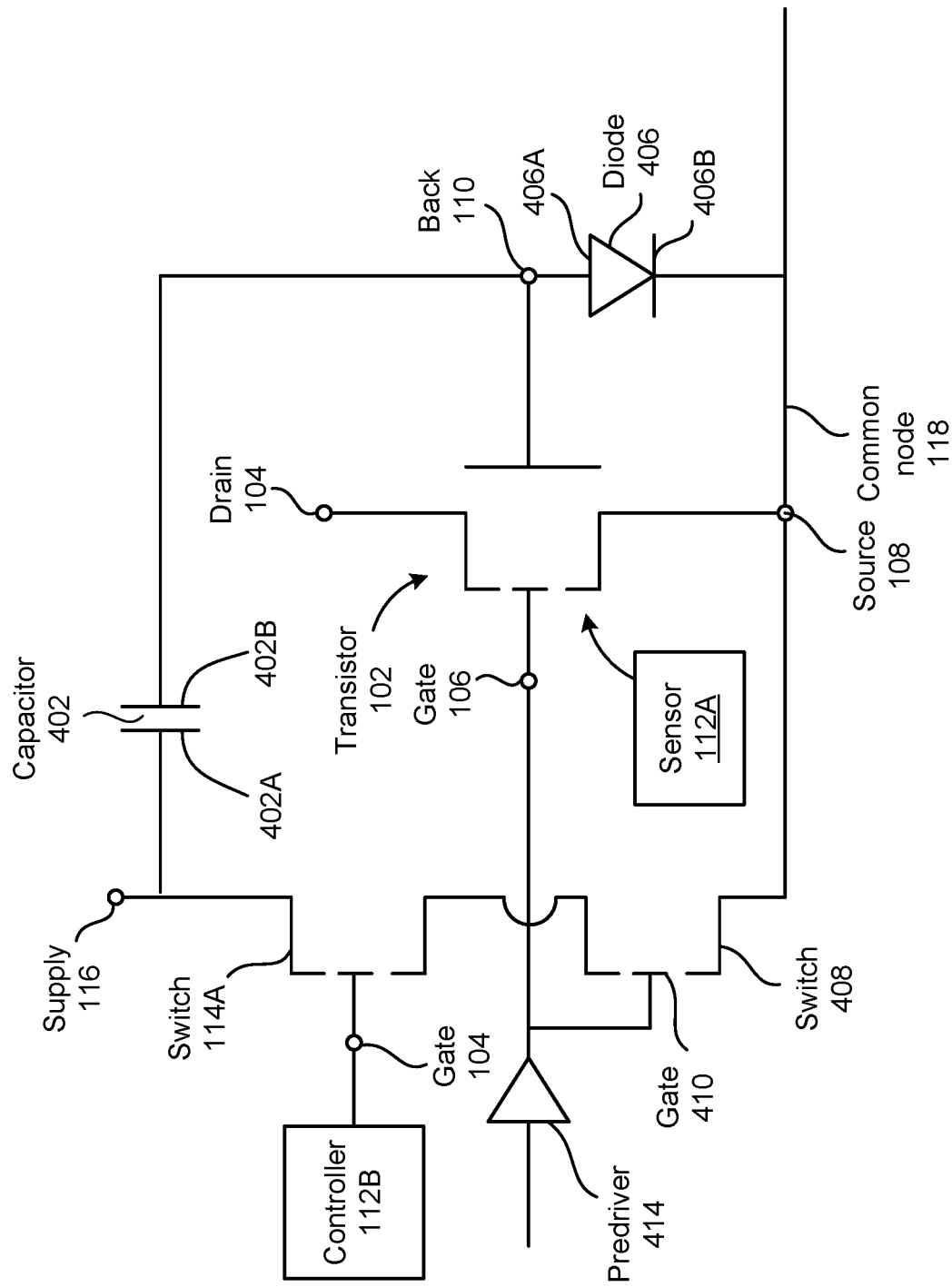
FIG. 4 is a diagram of a circuit for changing the voltage of the back electrode of the transistor in response to detecting an error condition according to an example.

FIG. 4 is a diagram of a circuit for changing the voltage of the back electrode 110 of the transistor 102 in response to detecting an error condition according to an example. In this example, the sensor 112 described with respect to FIGS. 1, 2A, 2B, and 2C can include a sensor 112A that senses and/or determines properties at one or more nodes on the transistor 102, and a switch controller 112B in communication with the sensor 112A that causes a switch 114A to conduct current between the supply 116 and a common node 118 in response to the sensor 112A detecting the error condition. The sensor 112A can include any features of the sensor 112 described above. The supply 116 can include a voltage source or a current source.

The switch 114A can be an example of the switch network 114 described with respect to FIG. 1. The switch 114A can be coupled to the supply 116. The switch 114A can include a transistor, such as a high-electron-mobility transistor (HEMT). In examples in which the switch 114A includes a HEMT, the high switching speed of the HEMT can enable the switch 114A to quickly respond to an error condition in the transistor 102, reducing the likelihood of damage to the transistor 102. A drain electrode of the switch 114A can be coupled to the supply 116, and a source electrode of the switch 114A can be coupled to a drain electrode of another switch 408 and/or to a common node 118.

The controller 112B can be coupled to a gate electrode 404 of the switch 114A, enabling the controller 112B to control whether the switch 114A is on, acts as a closed switch, and conducts current, or the switch 114A is off, acts as an open switch, and prevents current from flowing through the switch 114A. When the switch 114A is closed and conducts current, the supply 116 can be coupled to a common node 118 and to the source electrode 108 of the transistor 102.

The circuit can include a capacitor 402. The capacitor 402 can include a first end 402A, coupled to the supply 116 and to the switch 114A, and a second end 402B coupled to the back electrode 110 of the transistor 102 and to an anode 406A of a diode 406. The capacitor 402 can cause the voltage at the back electrode 110 to be capacitively pushed negative with respect to the source electrode 108 after the switch 114A is closed and/or turned on. When the switch 114A is off and/or open, the first end 402A of the capacitor 402 can build up charge. When the switch 114A turns on and/or becomes closed, the coupling of the first end 402A of the capacitor 402 to the common node 118 and/or source electrode 108 of the transistor can cause the second end 402B of the capacitor to quickly become negative, quickly reducing the voltage of the back electrode 110 of the transistor 102, reducing current flowing through the transistor 102 from the drain 104 to the source 108 and preventing damage to the transistor 102. The capacitor 402 can increase the speed at which the voltage at the back electrode 110 of the transistor 102 is reduced in response to the switch 114A turning on and/or closing, reducing the likelihood of damage to the transistor 102.

The circuit can include a predriver 412 controlling the gate electrode 106 of the transistor 102 and a gate 410 of a second switch 408 (the switch 114A may be considered a first switch). The second switch 408 can include a transistor such as a HEMT. The predriver 412 can provide a voltage to both the gate electrode 106 of the transistor 102, activating and/or turning on the transistor 102, and to the gate 410 of the second switch 408. The second switch 408 can be coupled to, and/or disposed between, the switch 114A and the common node 118, and can complete the path between the supply 116 and the common node. When the predriver 412 provides sufficient voltage, such as a threshold voltage, to both the gate electrode 106 of the transistor 102 and the gate 410 of the second switch 408, the transistor 102 can be activated and the second switch 408 can conduct current when the switch 114A is on and/or closed. When the predriver 412 does not provide sufficient voltage, both the transistor 102 and second switch 408 can turn off and/or open.

In some implementations, the transistor 102 can be implemented in a GaN substrate (and/or GaN epitaxial layer associated with a substrate) and can be co-packaged and/or co-integrated with the remaining components, such as the sensor 112A, controller 112B, supply 116, predriver 412, switch 408, capacitor 402, and/or diode 406, with the remaining components being implemented in a silicon substrate. In some implementations, the transistor 102 and the capacitor 402 can be implemented in a GaN substrate and the remaining components, with which the transistor 102 and capacitor 402 are co-packaged and/or co-integrated, can be implemented in silicon. In some implementations, all of the components can be implemented in, packaged in, and/or integrated in a GaN substrate.

Figure 5:
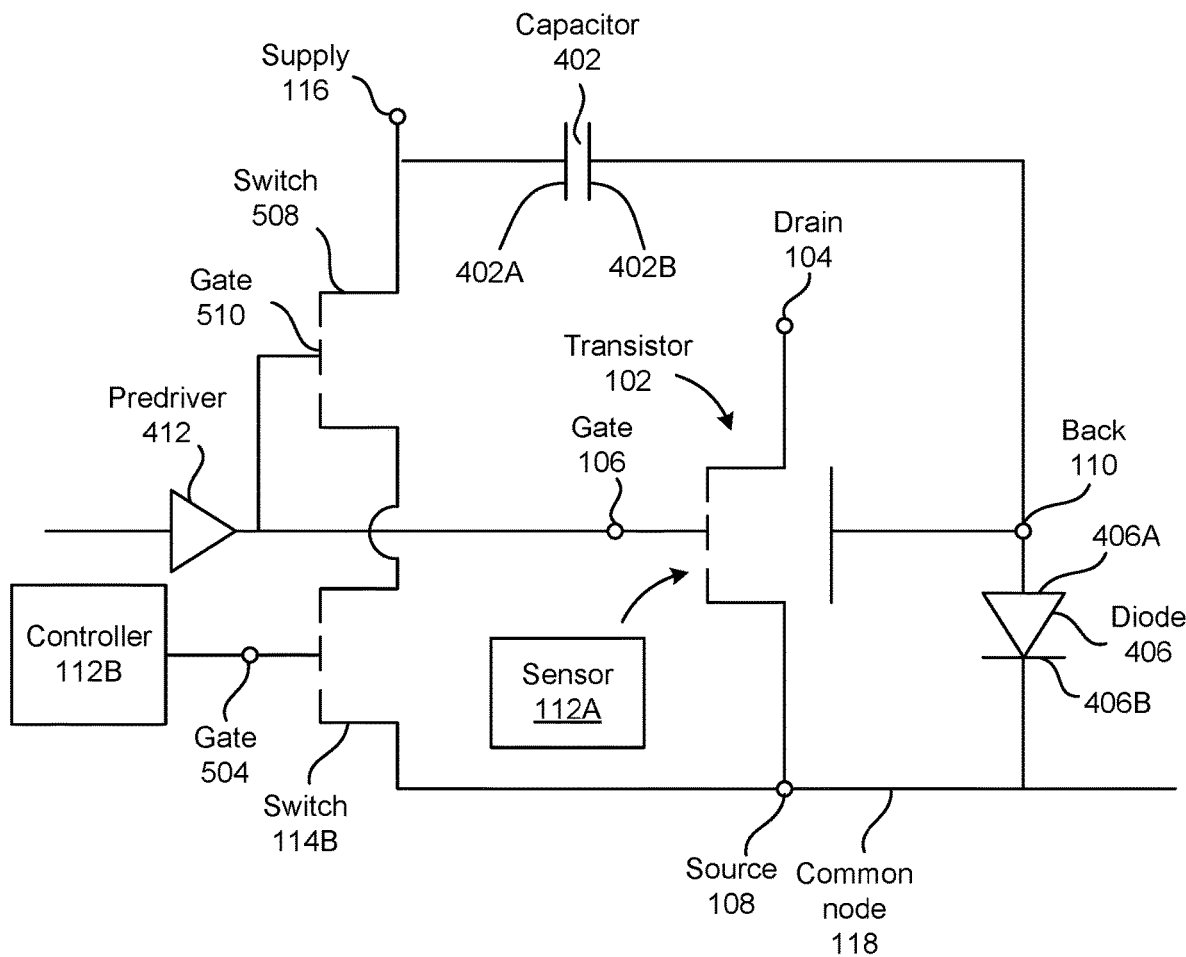
FIG. 5 is a diagram of a circuit for changing the voltage of the back electrode of the transistor in response to detecting an error condition according to an example.

FIG. 5 is a diagram of a circuit for changing the voltage of the back electrode 110 of the transistor 102 in response to detecting an error condition according to an example. In this example, a first end of a second switch 508, which can include features of the second switch 408 described above with respect to FIG. 4, can be coupled to the supply 116 and to the first end 402A of the capacitor, and a second end of the second switch 508 can be coupled to a switch 114B. The switch 114B can include features of any of the switches 114, 114A described above, and can be coupled between the second switch 508 and the common node 118. A drain electrode of the switch 114B can be coupled to the second switch 508 and/or to the supply 116, and a source electrode of the switch 114B can be coupled to the common node 118.

Figure 6:
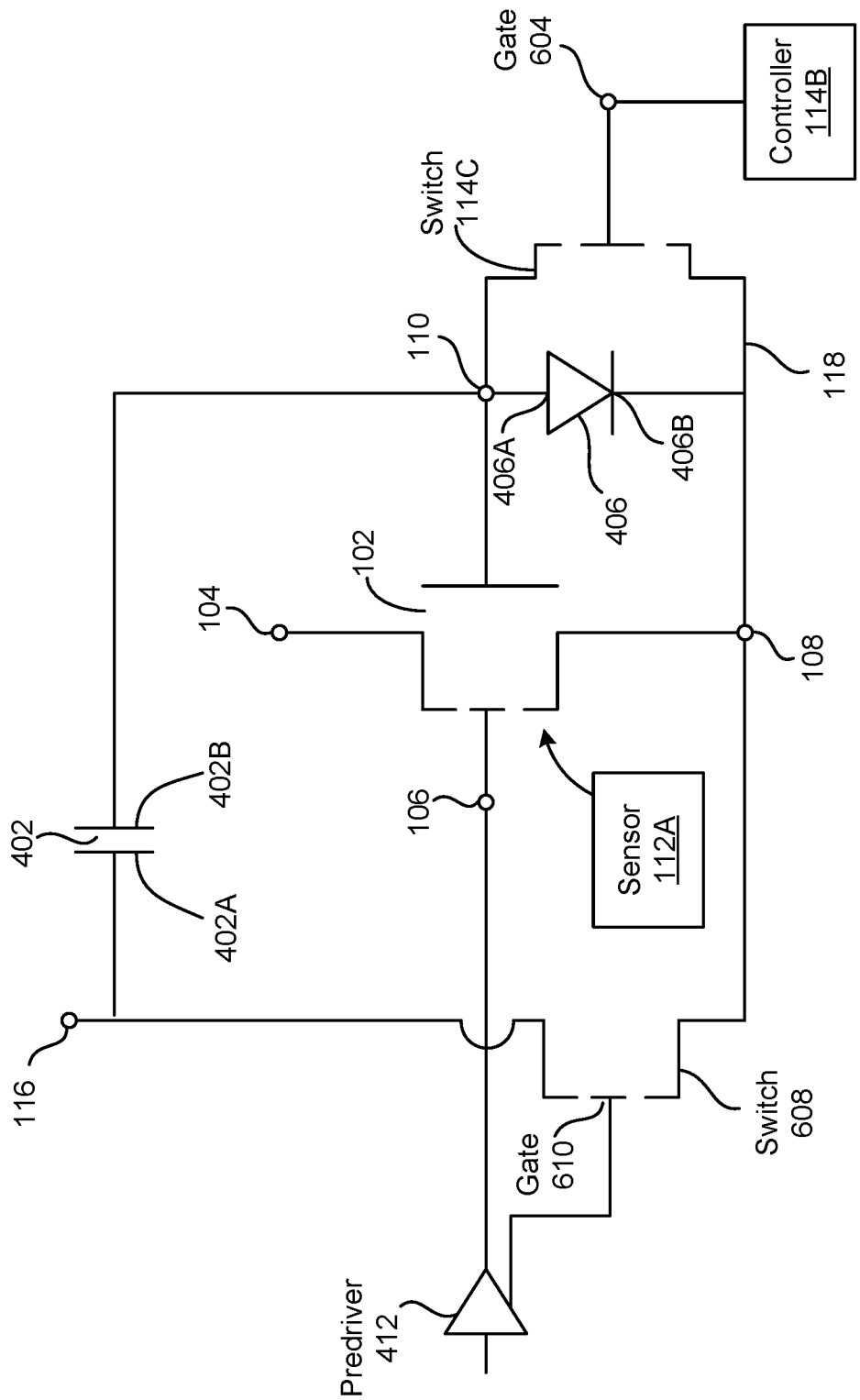
FIG. 6 is a diagram of a circuit for changing the voltage of the back electrode of the transistor in response to detecting an error condition according to an example.

FIG. 6 is a diagram of a circuit for changing the voltage of the back electrode 110 of the transistor 102 in response to detecting an error condition according to an example. In this example, a switch 114C, which can include features of any of the switches 114, 114A, 114B described above, can include a first end and a second end. The drain node and/or first end of the switch 114C can be coupled to the back electrode 110 of the transistor 102, to the second end 402B of the capacitor 402, and to the anode 406A of the diode 406. The source node and/or second end of the switch 114C can be coupled to the common node 118 and to the source 108 of the transistor 102. A first end of a second switch 608, which can include features of the second switch 408 described above with respect to FIG. 4, can be coupled to the supply 116 and to the first end 402A of the capacitor, and a second end of the second switch 608 can be coupled to a common node 118. Irrespective of the state of the switch 114C, the first end 402A of the capacitor 402 can build up charge. When the switch 114C turns off and/or becomes open, the coupling of the first end 402A of the capacitor 402 to the common node 118 and/or source electrode 108 of the transistor—in this example accomplished by switch 508—can cause the second end 402B of the capacitor 402 to quickly become negative, quickly reducing the voltage of the back electrode 110 of the transistor 102, reducing current flowing through the transistor 102 from the drain 104 to the source 108 and preventing damage to the transistor 102.

Figure 7:
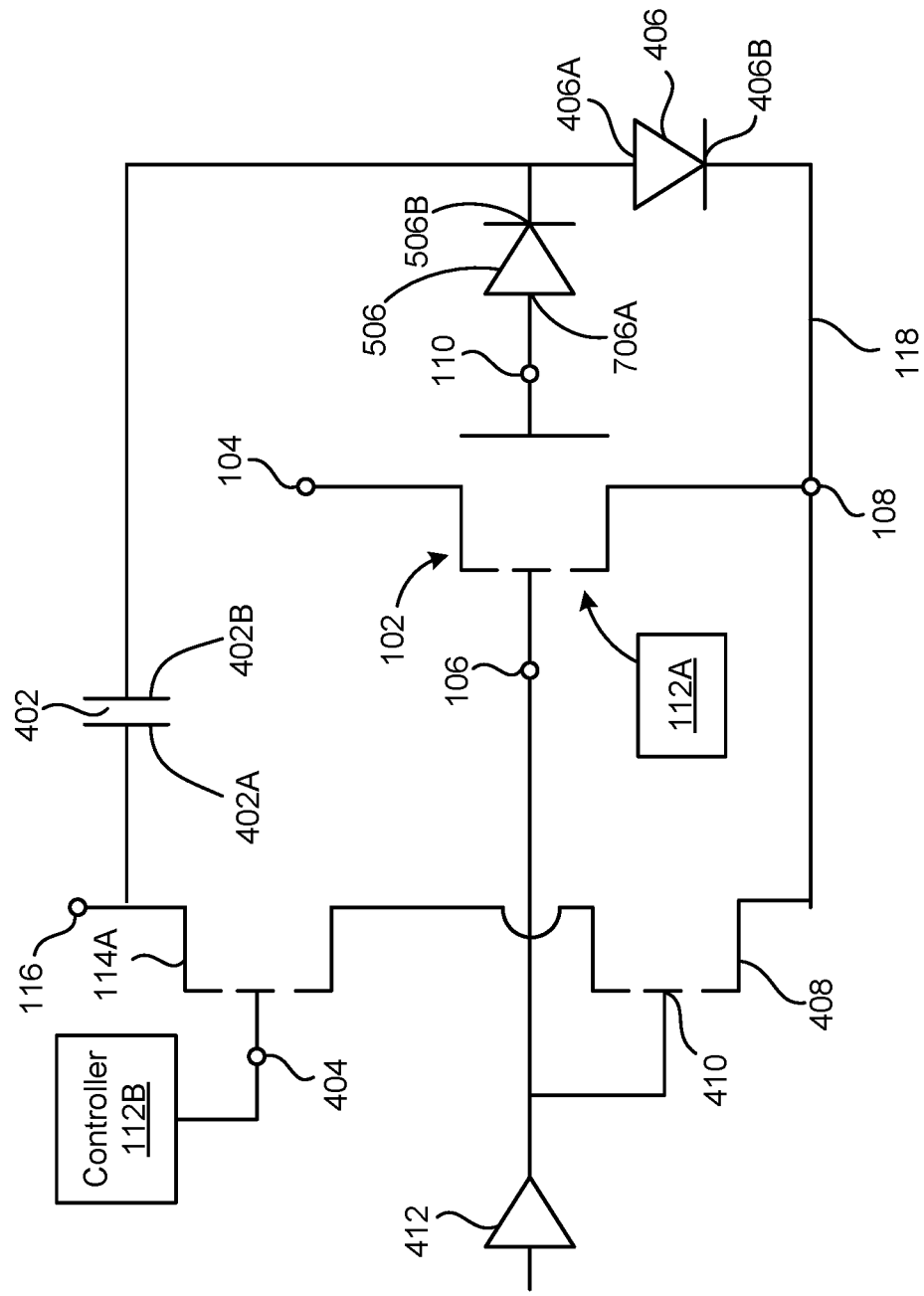
FIG. 7 is a diagram of a circuit for changing the voltage of the back electrode of the transistor in response to detecting an error condition according to an example.

FIG. 7 is a diagram of a circuit for changing the voltage of the back electrode 110 of the transistor 102 in response to detecting an error condition according to an example. The circuit of FIG. 7 includes the features of the circuit of FIG. 4 with the addition of a second diode 706 coupled between the back electrode 110 of the transistor 102 and the anode 406B of the diode 406 (which may be considered a first diode). In this example, an anode 706A of the second diode 706 is coupled to the back electrode 110 of the transistor 102. In this example, a cathode 706B of the second diode 706 is coupled to the second end 402B of the capacitor 402 and to the anode 406A of the first diode 406. The second diode 706 can act as a charge pump, preventing reverse charge flow and reducing and/or pushing down the voltage at the back electrode 110 of the transistor 102 each time the sensor 112A detects an error condition and the controller 112B turns on and/or closes the switch 114A, incrementally reducing current flow through the transistor 102.

Figure 8A:
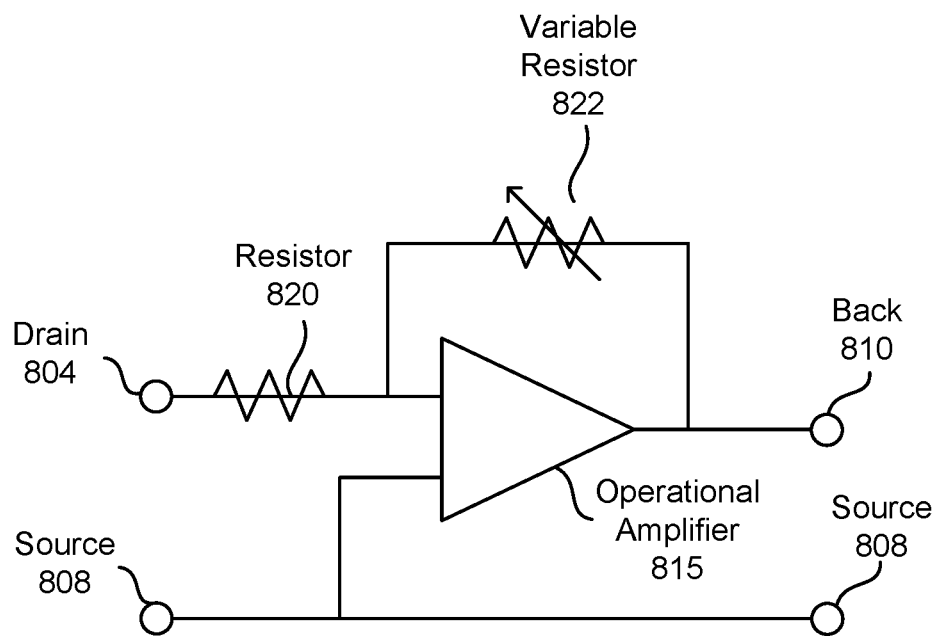
FIG. 8A is a diagram of a circuit that may be included in any of the circuits shown in FIG. 1, 4, 5, 6, or 7 according to an example.

FIG. 8A is a diagram of a circuit that may be included in any of the circuits shown in FIG. 1, 4, 5, 6, or 7 according to an example. In this example, the transistor 102 can be implemented as an operational amplifier 815, a resistor 820, and a variable resistor 822. In this example, a drain electrode 804, which corresponds to the drain electrode 104 described above, is coupled to a first end of the resistor 820. In some examples, a gate electrode instead of a drain electrode can be coupled to the first end of the resistor 820. In some examples, a driver supply instead of a drain electrode or gate electrode can be coupled to the first end of the resistor 820.

A second end of the resistor 820 is coupled to a first input node of the operational amplifier 815 and to a first end of the variable resistor 822. A second end of the variable resistor 822 is coupled to an output node of the operational amplifier 815 and to a back electrode 810. The back electrode 810 corresponds to the back electrode 110 described above. A second input node of the operational amplifier 815 can be coupled to a source electrode 808, which corresponds to the source electrode 108 described above. The variable resistor 822 can be a transistor, such as a GaN transistor, and the sensor 112 can be coupled between the gate and source terminals and/or electrodes of the transistor. The resistance of the variable resistor 822 can approach zero, making the variable resistor 822 a conductor when no error condition is detected, and the resistance of the variable resistor 822 can be orders of magnitude higher (such as ten or a hundred times higher) than the resistance of the resistor 802 when an error condition is detected.

Figure 8B:
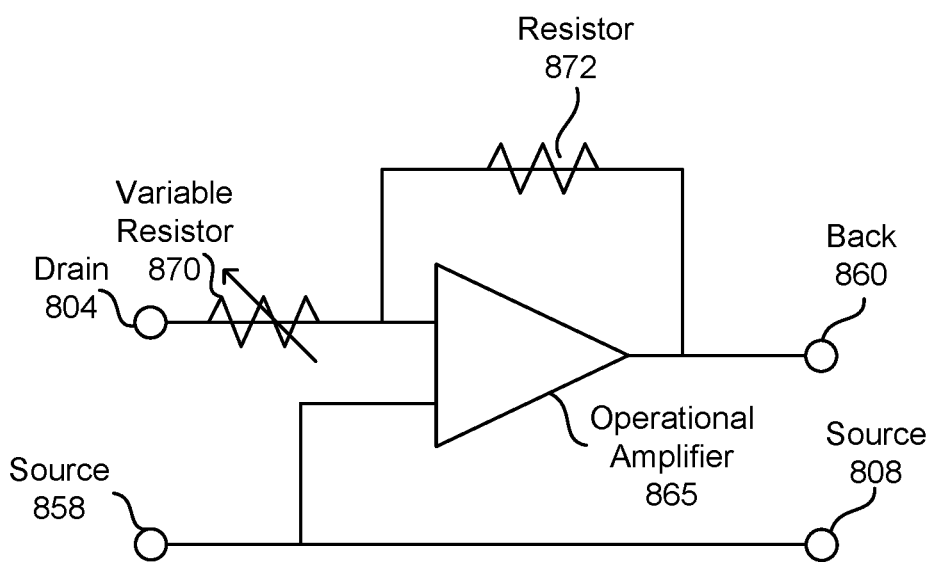
FIG. 8B is a diagram of a circuit that may be included in any of the circuits shown in FIG. 1, 4, 5, 6, or 7 according to an example.

FIG. 8B is a diagram of a circuit that may be included in any of the circuits shown in FIG. 1, 4, 5, 6, or 7 according to an example. In this example, the transistor 102 can be implemented as an operational amplifier 865, a variable resistor 870, and a resistor 872. In this example, a drain electrode 804, which corresponds to the drain electrode 104 described above, is coupled to a first end of the variable resistor 870. In some examples, a gate electrode instead of a drain electrode can be coupled to the first end of the variable resistor 870. In some examples, a driver supply instead of a drain electrode or gate electrode can be coupled to the first end of the resistor 820.

A second end of the variable resistor 870 is coupled to a first input node of the operational amplifier 865 and to a first end of the resistor 872. A second end of the resistor 872 is coupled to an output node of the operational amplifier 815 and to a back electrode 860. The back electrode 860 corresponds to the back electrode 110 described above. A second input node of the operational amplifier 815 can be coupled to a source electrode 868, which corresponds to the source electrode 108 described above. The variable resistor 870 can be a transistor, such as a GaN transistor, and the sensor 112 can be coupled between the gate and source terminals and/or electrodes of the transistor 102. The resistance of the variable resistor 870 can be very high, making the variable resistor 870 act as an open circuit when no error condition is detected, and the resistance of the variable resistor 870 can be orders of magnitude lower than (such as one-tenth or a one one-hundredth of) the resistance of the resistor 802 when an error condition is detected.

Figure 9:
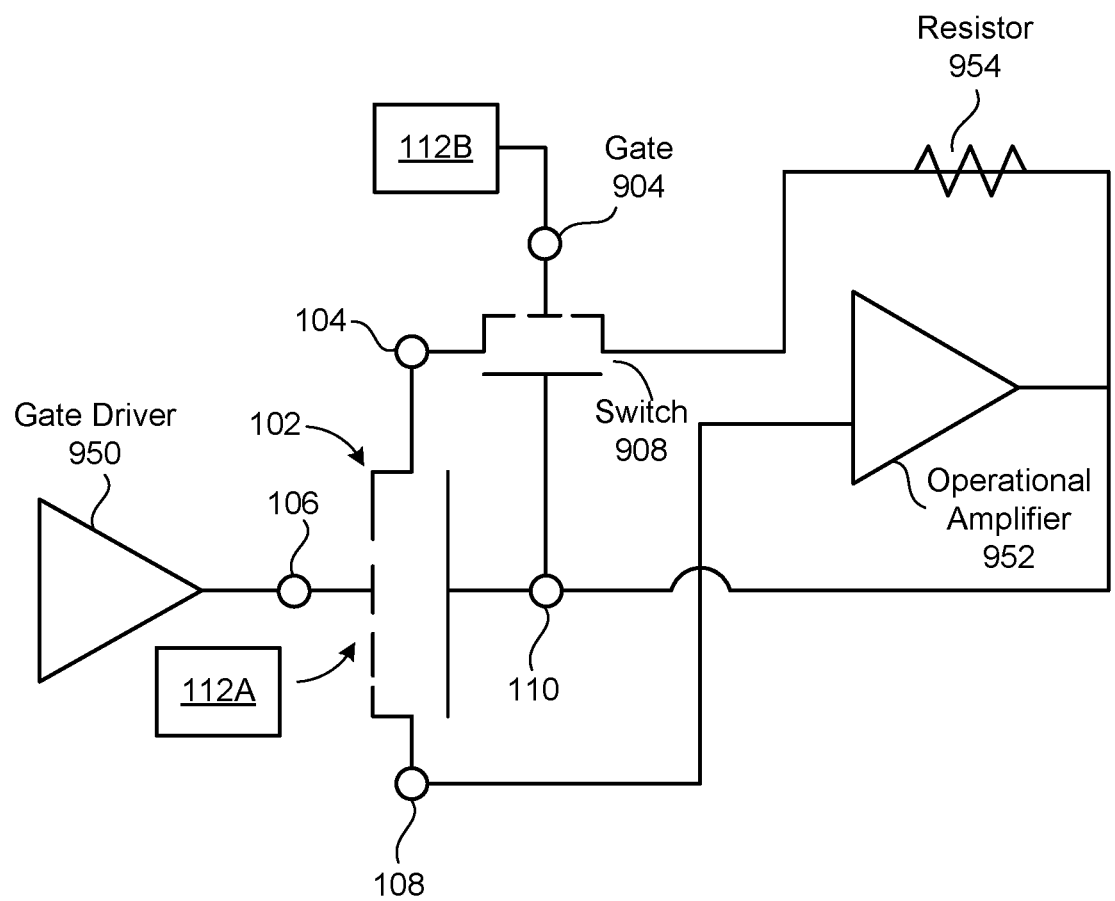
FIG. 9 is a diagram of a circuit for changing the voltage of the back electrode of the transistor in response to detecting an error condition according to an example.

FIG. 9 is a diagram of a circuit for changing the voltage of the back electrode 110 of the transistor 102 in response to detecting an error condition according to an example. In this example, a gate driver 950 can control the gate electrode 106 of the transistor 102. A switch 908 can be coupled between the drain electrode 104 of the transistor 102 and a first input of an operational amplifier 952. The switch 908 can include a transistor, such as a GaN transistor, and/or may be a positively-doped GaN transistor. The switch controller 112B can be coupled to a gate electrode 904 of the switch 908. The back electrode 110 of the transistor 102 can be coupled to a back electrode of the switch 908.

A second input of the operational amplifier 952 can be coupled to the source electrode 108 of the transistor 102. The first input of the operational amplifier 952 can be coupled to a first end of a resistor 954. A second end of the resistor 954 can be coupled to an output of the operational amplifier 952 and to the back electrode 110.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Implementations may be implemented in a computing system that includes a back end component, e.g., as a data server, or that includes a middleware component, e.g., an application server, or that includes a front end component, e.g., a client computer having a graphical user interface or a Web browser through which a user can interact with an implementation, or any combination of such back end, middleware, or front end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A circuit comprising:
   a transistor including a drain electrode, a gate electrode, a source electrode, and a back electrode;
   a sensor configured to detect an error condition in the transistor;
   a capacitor, the capacitor including:
      a first end coupled to the back electrode; and
      a second end coupled to a switch; and
   the switch configured to change a voltage at the back electrode in response to the sensor detecting the error condition in the transistor by closing and thereby coupling the second end of the capacitor to a common node, the change of the voltage at the back electrode reducing current flow between the drain electrode and the source electrode.

2. The circuit of claim 1, wherein the transistor includes a high-electron-mobility transistor.

3. The circuit of claim 1, wherein the change of the voltage at the back electrode increases a magnitude of a threshold voltage of the gate electrode.

4. The circuit of claim 1, wherein:
   the transistor comprises an n-channel device; and
   the change to the voltage at the back electrode causes the voltage at the back electrode to become negative with respect to the source electrode.

5. The circuit of claim 1, wherein the error condition includes a temperature measured by the sensor of at least one of the drain electrode, the gate electrode, or the source electrode exceeding a temperature threshold.

6. The circuit of claim 1, wherein the error condition includes a voltage measured by the sensor at the transistor exceeding a voltage threshold.

7. The circuit of claim 1, wherein the switch is a first switch, the circuit further comprises a second switch including:
   a first end coupled to the back electrode and to the first end of the capacitor; and
   a second end coupled to the common node.

8. A circuit comprising:
   a common node;
   a transistor including a drain electrode, a gate electrode, a source electrode, and a back electrode, the source electrode being electrically coupled to the common node;
   a current source;
   a switch coupled to the current source and to the common node;
   a capacitor coupled to the current source and to the back electrode;
   a diode including an anode and a cathode, the anode being electrically coupled to the capacitor and the back electrode, the cathode being electrically coupled to the common node;
   a sensor configured to detect an error condition at the transistor; and a switch controller configured to cause the switch to conduct current between the current source and the common node in response to the sensor detecting the error condition.

9. The circuit of claim 8, wherein:
the transistor comprises an n-channel device; and
the change to the voltage at the back electrode causes the voltage at the back electrode to become negative with respect to the source electrode.

10. The circuit of claim 8, wherein the diode comprises a high-electron-mobility transistor (HEMT), the HEMT comprising a drain node coupled to the capacitor and the back electrode, a gate electrode coupled to the capacitor, the back electrode, and the drain node, and a source node coupled the common node.

11. The circuit of claim 8, wherein the switch comprises a high-electron-mobility transistor.

12. The circuit of claim 8, wherein the transistor comprises a Gallium Nitride (GaN) transistor.

13. A circuit comprising:
a common node;
a transistor including a drain electrode, a gate electrode, a source electrode, and a back electrode, the source electrode being electrically coupled to the common node;
a current source;
a capacitor coupled to the current source and to the back electrode;
a first switch including a first node and a second node, the first node being electrically coupled to the capacitor, the back electrode and the second node being electrically coupled to the common node;
a second switch coupled to the current source and to the common node;
a diode including an anode and a cathode, the anode being electrically coupled to the capacitor, the back electrode, and the first node of the first switch, the cathode being electrically coupled to the common node;
a sensor configured to detect an error condition at the transistor; and
a switch controller configured to cause the first switch not to conduct current between the current source and the common node in response to the sensor detecting the error condition.

14. The circuit of claim 13, wherein the diode comprises a high-electron-mobility transistor (HEMT), the HEMT comprising a drain node coupled to the capacitor and the back electrode, a gate electrode coupled to the capacitor, the back electrode, and the drain node, and a source node coupled the common node.

15. The circuit of claim 13, wherein the switch comprises a high-electron-mobility transistor.

16. The circuit of claim 13, wherein the transistor comprises a Gallium Nitride (GaN) transistor.

17. A circuit comprising:
a common node;
a transistor including a drain electrode, a gate electrode, a source electrode, and a back electrode, the source electrode being electrically coupled to the common node;
a current source;
a switch coupled to the current source and to the common node;
a capacitor coupled to the current source;
a first diode comprising a first anode and a first cathode, the first anode being electrically coupled to the capacitor, the first cathode being electrically coupled to the common node;
a second diode comprising a second anode and a second cathode, the second anode being electrically coupled to the back electrode, the second cathode being electrically coupled to the first anode and to the capacitor;
a sensor configured to detect an error condition at the transistor; and
a switch controller configured to cause the switch to conduct current between the current source and the common node in response to the sensor detecting the error condition.

18. The circuit of claim 17, wherein the diode comprises a high-electron-mobility transistor (HEMT), the HEMT comprising a drain node coupled to the capacitor and the back electrode, a gate electrode coupled to the capacitor, the back electrode, and the drain node, and a source node coupled the common node.

19. The circuit of claim 17, wherein the switch comprises a high-electron-mobility transistor.

20. The circuit of claim 17, wherein the transistor comprises a Gallium Nitride (GaN) transistor.

* * * * *